(12) United States Patent
Andryushchenko et al.

(10) Patent No.: US 7,560,380 B2
(45) Date of Patent: Jul. 14, 2009

(54) CHEMICAL DISSOLUTION OF BARRIER AND ADHESION LAYERS

(75) Inventors: Tatyana N. Andryushchenko, Portland, OR (US); Anne E. Miller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 11/588,982

(22) Filed: Oct. 27, 2006

(65) Prior Publication Data
US 2008/0102631 A1 May 1, 2008

(51) Int. Cl.
*H01L 21/20* (2006.01)
(52) U.S. Cl. .................. 438/637; 438/628; 438/653; 438/656; 438/687; 257/E21.017; 257/E21.303; 257/E21.309; 257/E21.583; 257/E21.588
(58) Field of Classification Search ........... 438/674, 438/675, 687, 695, 697, 699, 700, 626, 628, 438/637, 653, 656; 257/E21.174, 304, 583, 257/585, E21.017, 303, 309, 586, 588
See application file for complete search history.

(56) References Cited

U.S. PATENT DOCUMENTS

| | | | | |
|---|---|---|---|---|
| 5,882,498 | A * | 3/1999 | Dubin et al. ............... 205/261 |
| 6,120,641 | A * | 9/2000 | Stevens et al. ......... 156/345.22 |
| 6,153,460 | A * | 11/2000 | Ohnishi et al. ............ 438/238 |
| 6,168,704 | B1 * | 1/2001 | Brown et al. .............. 205/118 |
| 6,315,883 | B1 * | 11/2001 | Mayer et al. .............. 205/123 |
| 6,399,479 | B1 * | 6/2002 | Chen et al. ................ 438/628 |
| 6,436,825 | B1 * | 8/2002 | Shue ........................ 438/687 |
| 6,440,295 | B1 * | 8/2002 | Wang ........................ 205/640 |
| 6,793,797 | B2 * | 9/2004 | Chou et al. ................ 205/103 |
| 7,077,725 | B2 * | 7/2006 | Sun et al. .................... 451/41 |
| 7,084,059 | B2 * | 8/2006 | Thomas et al. ............ 438/674 |
| 7,223,685 | B2 | 5/2007 | Andryushchenko |
| 2007/0152252 | A1 | 7/2007 | Buehler |

OTHER PUBLICATIONS

Robin, A., "Corrosion behavior of tantalum in sodium hydroxide solutions", Journal of Applied Electrochemistry vol. 33, No. 1 : 37-42, Jan. 2003.

* cited by examiner

*Primary Examiner*—Michael S Lebentritt
(74) *Attorney, Agent, or Firm*—Rahul D. Engineer

(57) ABSTRACT

A method of forming a metal interconnect for an integrated circuit includes depositing a barrier layer on a dielectric layer having a trench formed therein, depositing an adhesion layer on the barrier layer, depositing a metal layer on the adhesion layer, removing the metal layer using a CMP process until at least a portion of the adhesion layer is exposed, and removing portions of the adhesion layer and the barrier layer sited substantially outside of the trench using a dissolution process. The dissolution process applies an electrolyte solution to those portions of the adhesion layer and the barrier layer sited substantially outside of the trench to dissolve and remove them.

23 Claims, 7 Drawing Sheets

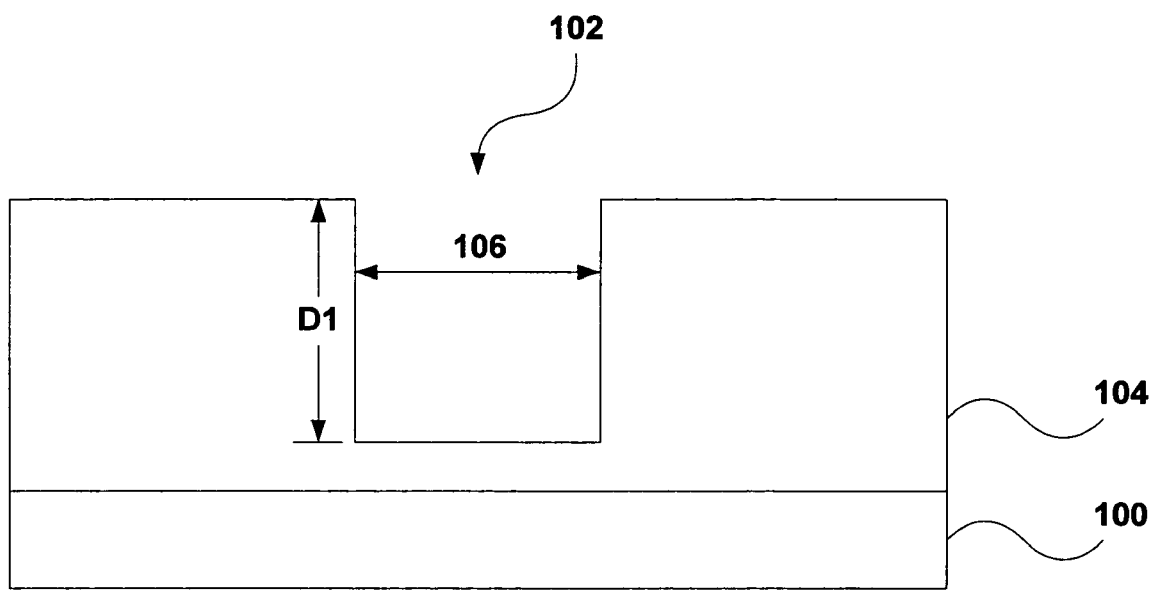
FIG._1A
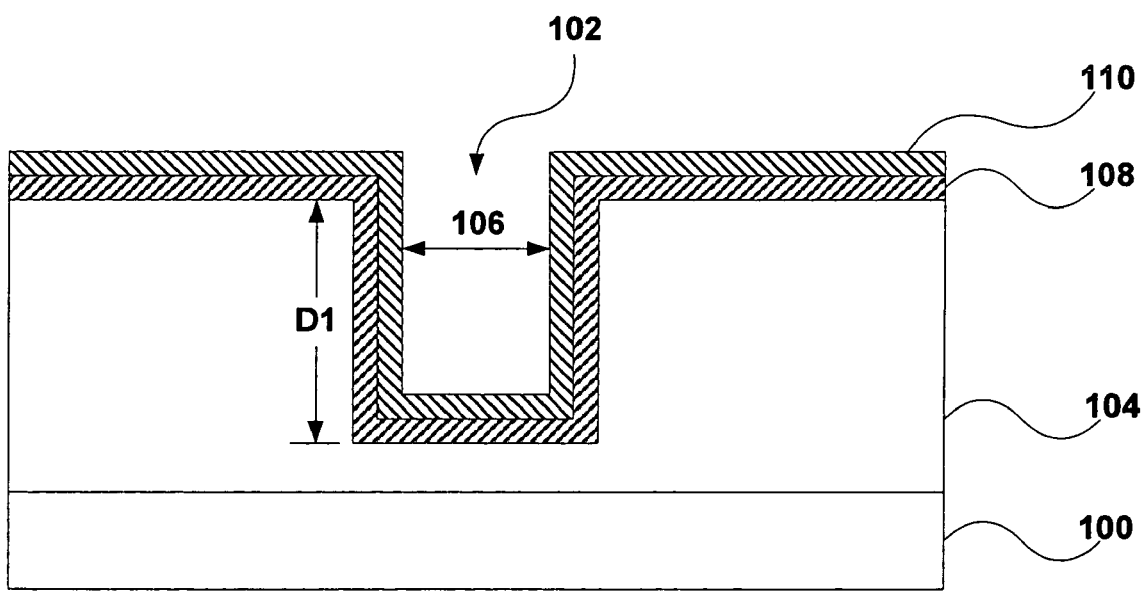
FIG._1B

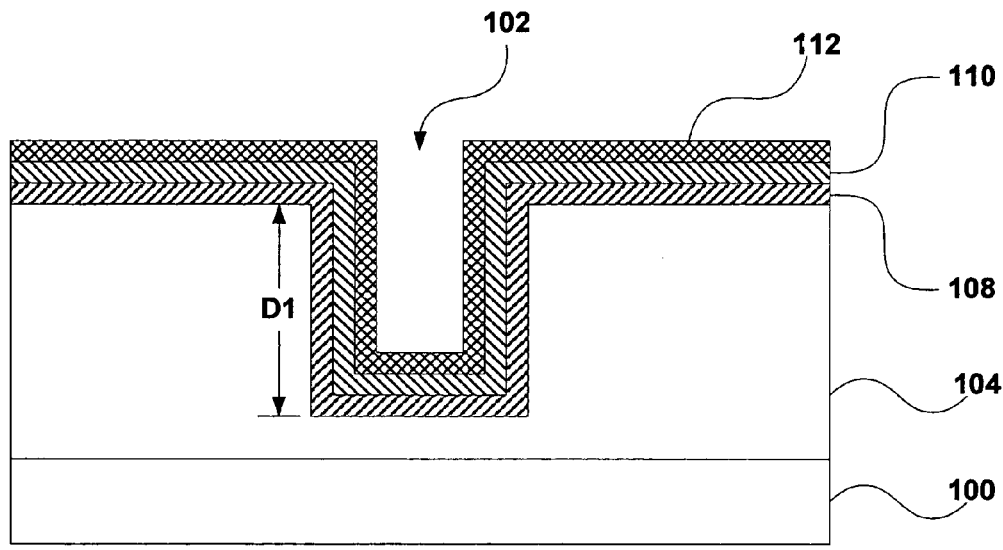
FIG._1C
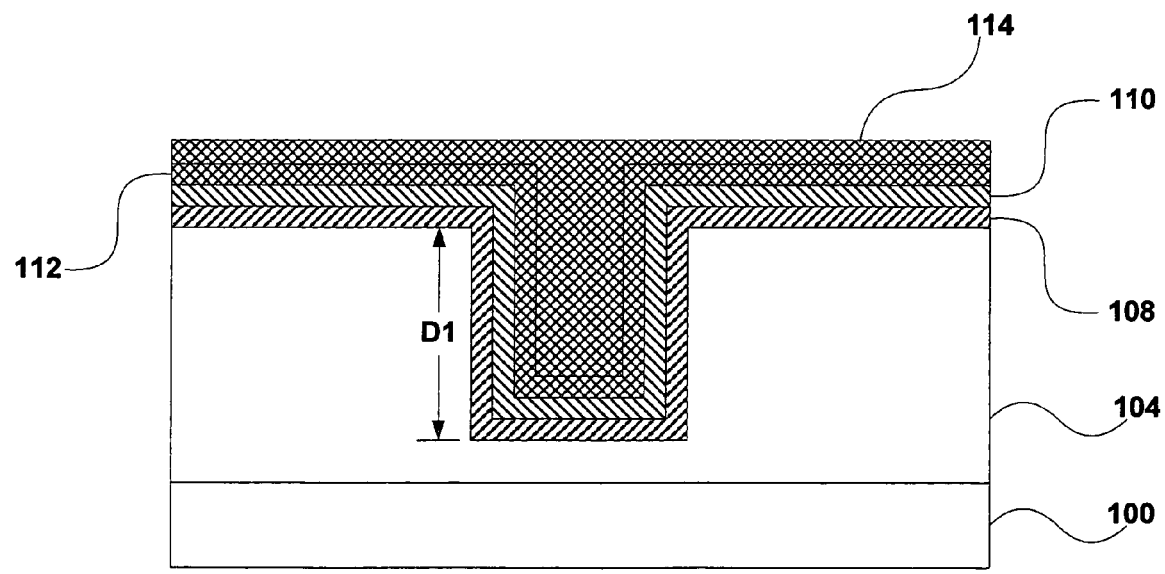
FIG._1D

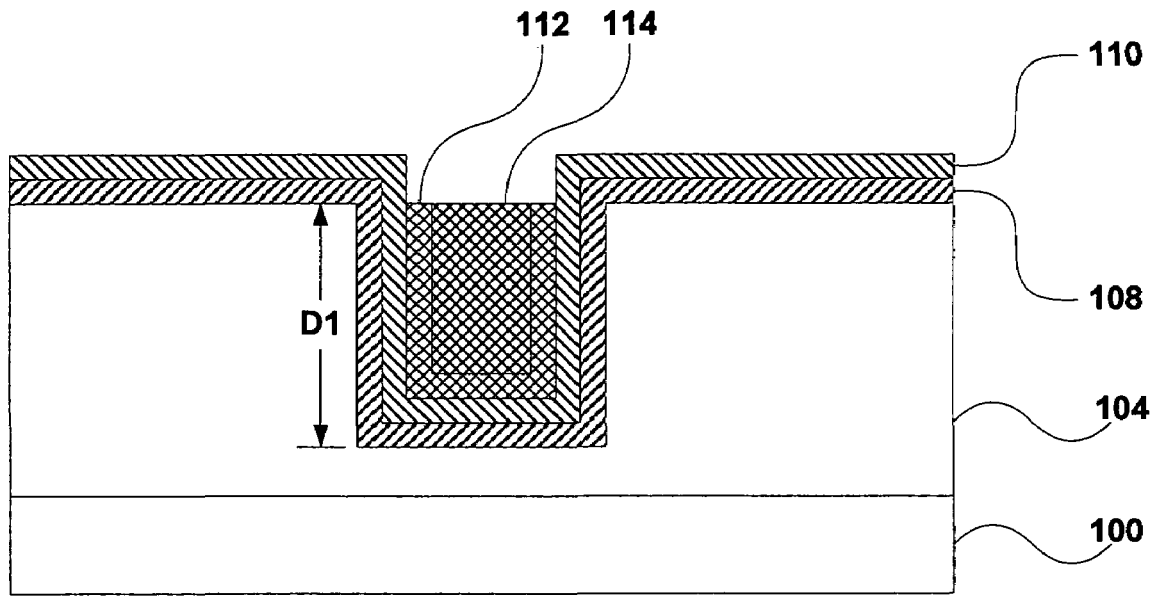
FIG._1E
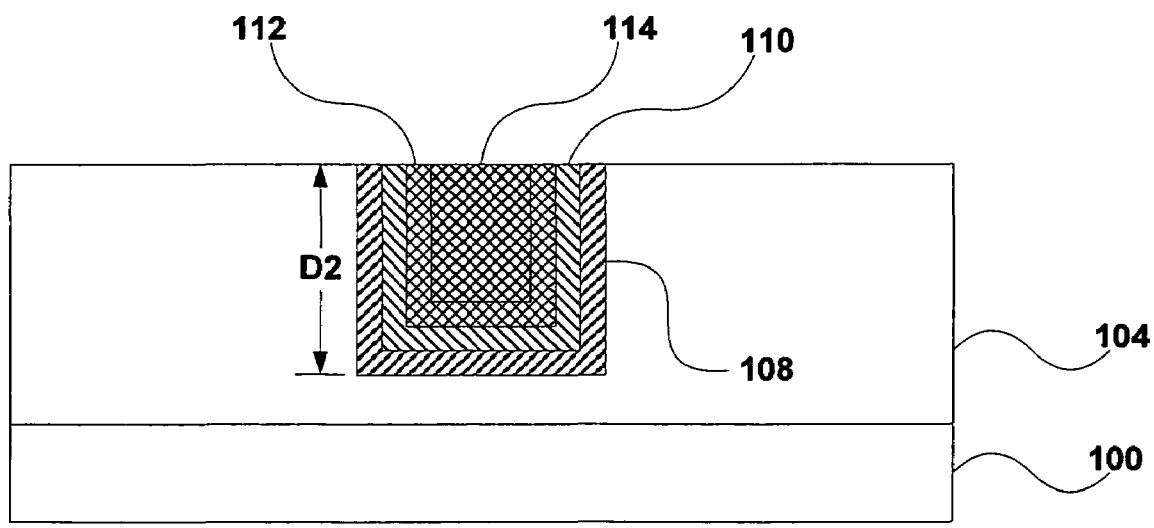
FIG._1F

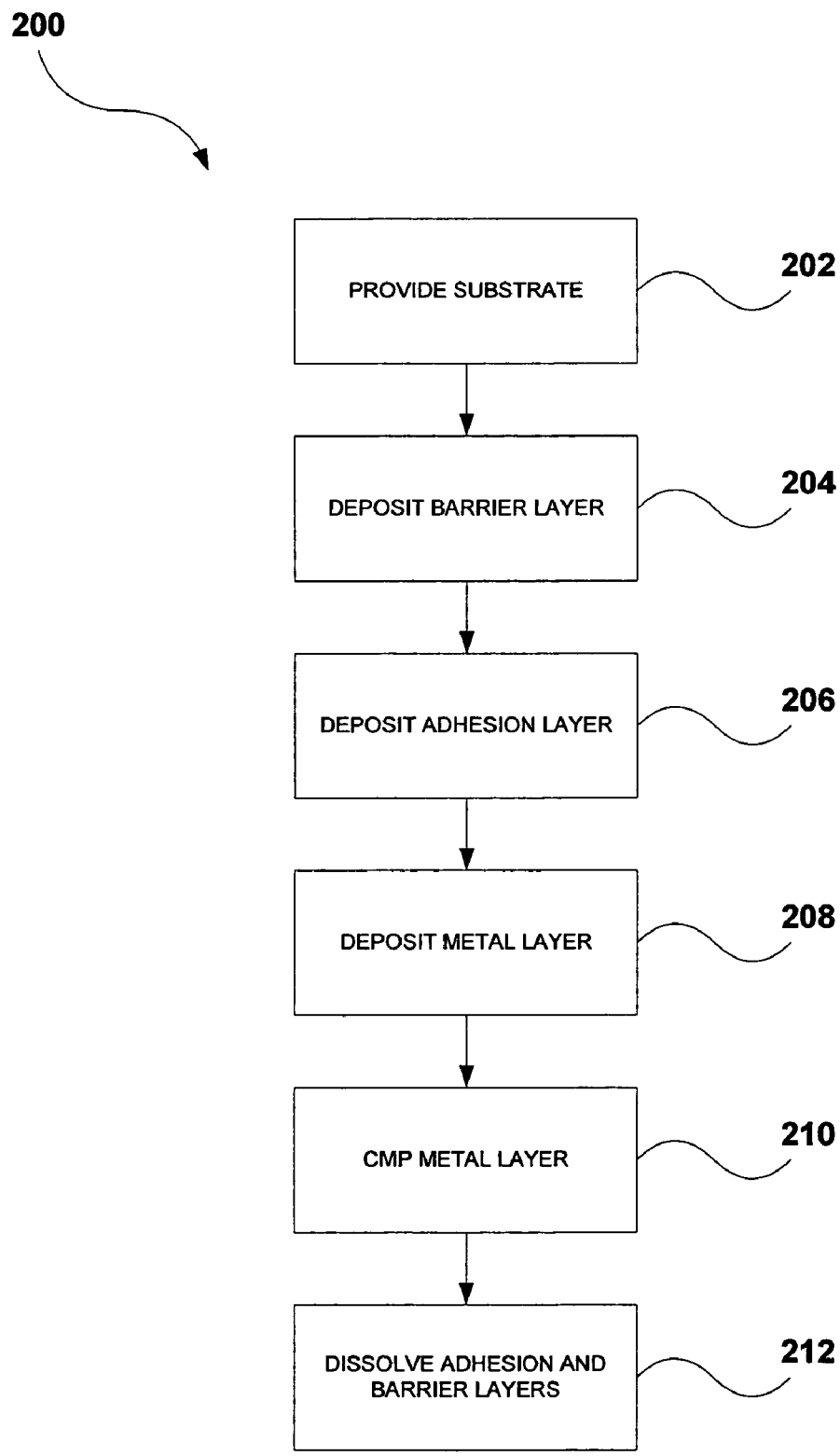
FIG._2

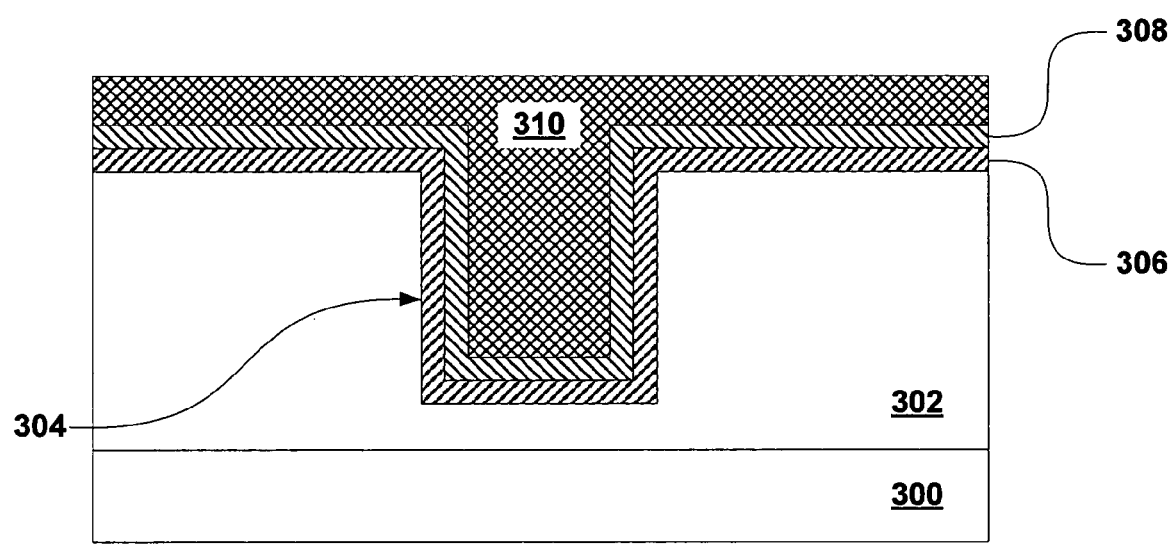
FIG._3A

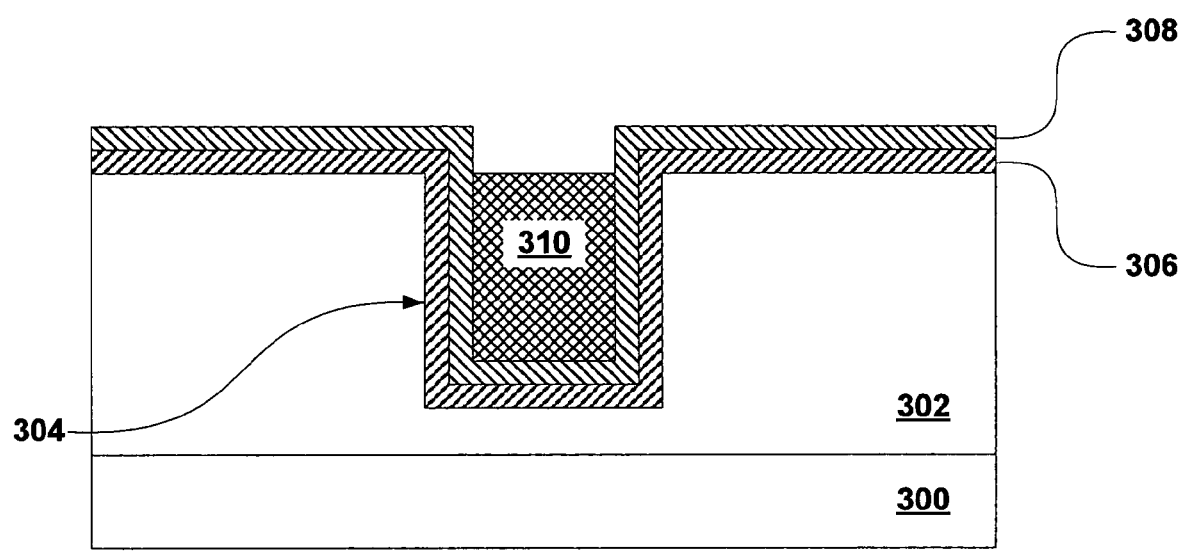
FIG._3B

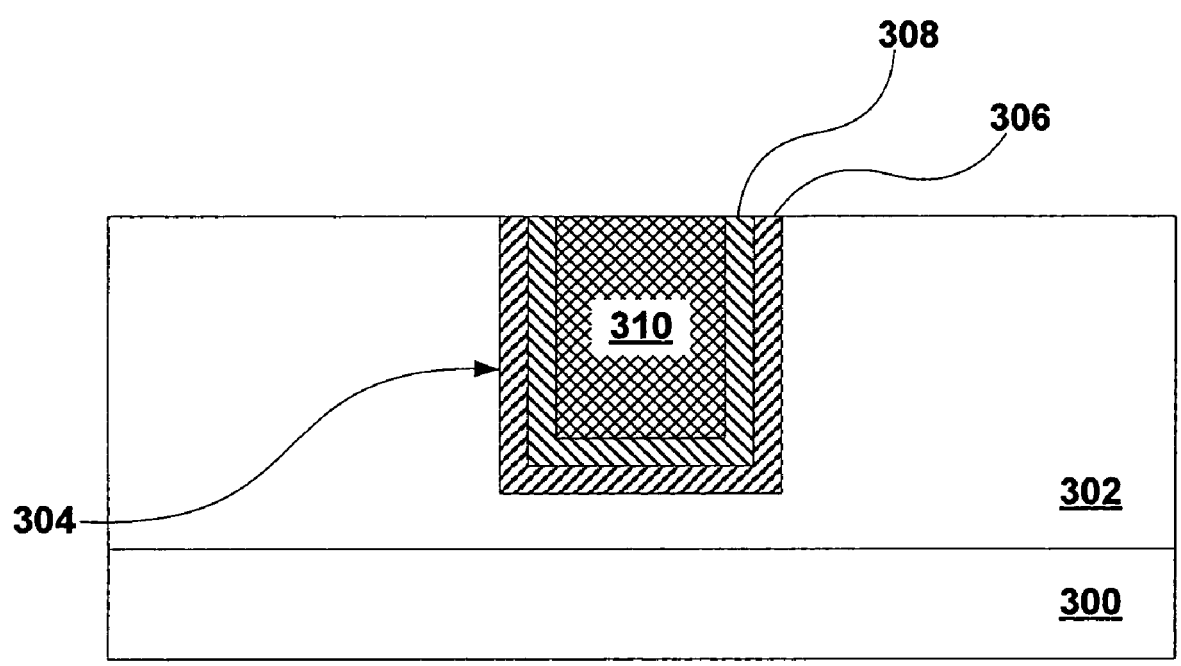
FIG._3C

CHEMICAL DISSOLUTION OF BARRIER AND ADHESION LAYERS

BACKGROUND

In the manufacture of integrated circuits, copper interconnects are generally formed on a semiconductor substrate using a copper dual damascene process. Such a process begins with a trench being etched into a dielectric layer and filled with a barrier layer, an adhesion layer, and a seed layer. A physical vapor deposition (PVD) process, such as a sputtering process, may be used to deposit a tantalum nitride (TaN) barrier layer and a tantalum (Ta) or ruthenium (Ru) adhesion layer (i.e., a TaN/Ta or TaN/Ru stack) into the trench. The TaN barrier layer prevents copper from diffusing into the underlying dielectric layer. The Ta or Ru adhesion layer is required because the subsequently deposited metals do not readily nucleate on the TaN barrier layer. This may be followed by a PVD sputter process to deposit a copper seed layer into the trench. An electroplating process is then used to fill the trench with copper metal to form the interconnect.

Once the trench is filled, a chemical mechanical polishing (CMP) process is used to remove excess copper metal and excess portions of the barrier and adhesion layers. CMP is well known in the art and generally involves the use of a rotating polishing pad and an abrasive, corrosive slurry on a semiconductor wafer. After a material is deposited on the surface of a semiconductor wafer, the polishing pad and the slurry physically grind flat the microscopic topographic features until the material is planarized, thereby allowing subsequent processes to begin on a flat surface. In many cases the material is further polished by the polishing pad until the material is reduced to a predetermined thickness or until another material is exposed. Chemical reactions that take place between the slurry and the wafer surface further contribute to the planarizing process.

One drawback to the use of CMP for removing the barrier layer and the adhesion layer is that a polishing pad may not polish the entire surface of the wafer in a consistent manner. This causes the surface of the wafer to be uneven with certain areas being overpolished and other areas being underpolished. For instance, when CMP is used for removing the barrier and adhesion layers, the copper metal remaining in the trench is often overpolished or underpolished. A CMP process may also cause significant damage and erosion to the low-k dielectric material below the barrier layer. Furthermore, as line size decreases with interconnect scaling, the probability of bent copper interconnects or other deformations increases when CMP is used.

Conventional etching processes have been attempted to replace CMP of the barrier and adhesion layers. For instance, a wet etch process using concentrated hydrofluoric (HF) acid combined with a strong oxidizer such as $HNO_3$ is often used. Unfortunately, the HF chemistry induces significant loss of dielectric material for silicon-based dielectric materials such as silicon dioxide ($SiO_2$), carbon doped oxide (CDO), porous CDO, plasma tetraethyl orthosilicate (PTEOS), and fluorinated silicon oxide (SiOF). Furthermore, the addition of strong oxidizers is undesirable as the oxidizers tend to increase the loss of copper metal and may cause corrosion defects.

Dry etch processes have also been used. One such dry etch process uses tetrafluoromethane ($CF_4$) and oxygen ($O_2$) in an argon (Ar) ion plasma. Though the barrier and adhesion layers are removed, this dry etch process tends to cause substantial contamination of the semiconductor wafer and the reactor with non-volatile metal species, such as copper and tantalum species if tantalum is used in the barrier or adhesion layers.

Therefore, an improved method for removing the barrier and adhesion layers is needed that reduces damage to the low-k dielectric material and the copper interconnects.

BRIEF DESCRIPTION OF THE DRAWINGS

FIGS. 1A to 1F illustrate drawbacks to using CMP when removing excess barrier and adhesion layers.

FIG. 2 is a method of removing excess portions of an adhesion layer and a barrier layer using a dissolution process in accordance with an implementation of the invention.

FIGS. 3A to 3C illustrate various structures that are formed when the method of FIG. 2 is carried out.

DETAILED DESCRIPTION

Described herein are systems and methods of removing a barrier layer and an adhesion layer during the fabrication of a copper interconnect for an integrated circuit device. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide a method by which a copper interconnect may be formed with significantly less erosion to a dielectric layer surrounding the copper interconnect. In accordance with implementations of the invention, the CMP process for removing adhesion and barrier layers during the fabrication of a copper interconnect is replaced with a chemical dissolution process. The chemical dissolution process removes the adhesion and barrier layers while protecting the underlying dielectric layer. The CMP process is still used to remove the excess copper metal.

For reference, FIGS. 1A to 1F illustrate a conventional damascene process for fabricating copper interconnects on a semiconductor wafer. FIG. 1A illustrates a substrate 100, such as a semiconductor wafer, that includes a trench 102 that has been etched into a dielectric layer 104. The trench 102 includes a gap 106 through which metal may enter during metallization processes. As shown, the trench 102 has a depth "D1" that corresponds to a potential height for the copper interconnect being formed.

FIG. 1B illustrates the deposition of a conventional barrier layer 108 and a conventional adhesion layer 110 into the trench 102. The barrier layer 108 prevents copper metal from diffusing into the dielectric layer 104. The adhesion layer 110 enables copper metal to become deposited onto the barrier layer 108. The barrier layer 108 is generally formed using a material such as tantalum nitride (TaN) and is deposited using a PVD process. The barrier layer 108 may be around 3 Angstroms (Å) to 10 nanometers (nm) thick, although it is generally around 5 nm thick. The adhesion layer 110 is generally formed using a metal such as tantalum (Ta) or ruthenium (Ru) and is also deposited using a PVD process. The adhesion layer 110 is generally around 5 nm to 10 nm thick.

After the adhesion layer 110 is formed, two deposition processes are used to fill the trench 102 with copper metal. The first deposition process is a PVD process that deposits a copper seed layer. The second deposition process is a plating process, such as an electroplating (EP) process or an electroless plating (EL) process, that deposits a bulk copper layer to fill the trench 102.

FIG. 1C illustrates the deposition of a conventional copper seed layer 112 onto the adhesion layer 110 using a PVD process. The copper seed layer 112 enables or catalyzes a subsequent plating process to fill the interconnect with copper metal. FIG. 1D illustrates the deposition of a bulk copper layer 114 onto the copper seed layer 112 using an EP or EL copper deposition process. As shown, the bulk copper layer 114 not only fills the trench 102, but it covers the barrier layer 108 and the adhesion layer 110 as well.

FIG. 1E illustrates the results of a chemical mechanical polishing (CMP) process used to polish the bulk copper layer 114 and the copper seed layer 112 down to the adhesion layer 110. This confines the copper metal to an area within the trench 102, thereby forming a copper interconnect. As shown, the CMP process for the bulk copper layer 114 and the copper seed layer 112 typically overpolishes the copper metal.

The CMP process then continues in order to remove excess portions of the adhesion layer 110 and the barrier layer 108, which electrically isolates the copper interconnect. A slurry and CMP chemistry targeted specifically for the metals used in the adhesion layer 110 and the barrier layer 108 may be used. FIG. 1F illustrates the result of a CMP process used to remove the excess adhesion layer 110 and barrier layer 108. Unfortunately, due to the relatively fragile nature of low-k dielectric materials, a significant portion of the dielectric layer 104 has been eroded and removed by the CMP process. This results in a trench depth "D2" that is shallower than the original trench depth "D1", thereby reducing the thickness of the copper interconnect. And as will be recognized by those of skill in the art, decreasing the thickness of a copper interconnect causes an increase in the electrical resistance of the interconnect. In addition, the top surface of the polished copper metal may be recessed or may protrude depending on the selectivity of the slurry used for the CMP process.

Accordingly, implementations of the invention provide a method of forming a copper interconnect without causing significant erosion to the dielectric layer. In an implementation of the invention, a dissolution process is used to remove the barrier and adhesion layers. The dissolution process may apply an electrolyte composition to the adhesion layer and the barrier layer to dissolve the metal without the need for a CMP process. In accordance with implementations of the invention, the electrolyte composition may contain a base such as potassium hydroxide (KOH) or sodium hydroxide (NaOH). The electrolyte composition may further include an additive to protect the exposed dielectric material, such as tetraethyl orthosilicate (TEOS).

FIG. 2 is a process 200 of forming a metal interconnect in accordance with an implementation of the invention. First a substrate is provided, such as a semiconductor wafer (202). The substrate includes a dielectric layer and a trench formed within the dielectric layer. The substrate may be formed from materials such as silicon, germanium, silicon-on-insulator, or other semiconductor substrates known in the art. The dielectric layer may be a material such as silicon dioxide, carbon doped oxide, low-k dielectric material, and porous dielectric materials. Other conventional dielectric layers may be used as well. The trench may be formed in the dielectric layer using an etching process.

Next, a barrier layer is deposited onto the substrate (204). Conventional deposition processes may be used to deposit the barrier layer, such as a PVD process or an atomic layer deposition (ALD) process. The barrier layer is formed on the dielectric layer and covers the sidewalls and the bottom of the trench that is formed in the dielectric layer. In various implementations, the barrier layer may be formed using metals that include, but are not limited to, tantalum (Ta), titanium, ruthenium, as well as their alloys with nitrogen, silicon, and carbon (e.g., tantalum nitride, titanium nitride, ruthenium nitride, tantalum silicide, titanium silicide, ruthenium silicide, tantalum carbide, titanium carbide, and ruthenium carbide. The barrier layer in many implementations may be around 3 Å to 10 nm thick.

An adhesion layer is formed over the barrier layer (206). The adhesion layer is generally formed from a metal such as tantalum or ruthenium using a deposition process such as PVD or ALD. The adhesion layer is generally around 5 nm to 10 nm thick. The adhesion layer forms a layer that substantially covers the barrier layer.

A metal layer is then deposited over the adhesion layer (208). The metal used in the metal layer may be any metal suitable for use in an interconnect for an integrated circuit. For instance, the metal may be copper, a copper alloy, aluminum, an aluminum alloy, silver, or a variety of other metals. It is generally copper metal or a copper alloy that is used to form the metal layer. One or more deposition processes such as an electroplating or an electroless plating process may be used to deposit the metal layer. In one implementation, for instance, a copper seed layer is deposited on the adhesion layer using an electroless plating process, followed by the deposition of a bulk copper layer using an electroplating process. The deposition of the metal layer fills the trench with metal and forms a layer of metal over the adhesion layer.

The structure formed in processes 202 through 208 is shown in FIG. 3A, which illustrates a substrate 300 that includes a dielectric layer 302 having a trench 304. A barrier layer 306 is formed on the dielectric layer 302, including on the sidewalls and bottom of the trench 304. An adhesion layer 308 is formed over the barrier layer 306. As shown, a metal layer 310, such as a copper containing layer, fills the remainder of the trench 304 and forms a layer of metal over the adhesion layer 308.

Returning to FIG. 2, the process 200 continues by removing a portion of the metal layer using a CMP process (210). In accordance with an implementation of the invention, the CMP process is used to remove a substantial portion of the metal layer that is outside of the trench. For instance, the CMP process may be used to polish and remove the metal layer down to the surface of the adhesion layer.

FIG. 3B illustrates the result of a CMP process used to polish the metal layer 310 down to the adhesion layer 308. This process confines the metal to an area within the trench 304, thereby forming a metal interconnect. As shown, a top surface of the metal within the trench is recessed, as generally happens during this CMP process.

In accordance with an implementation of the invention, a dissolution process is carried out to remove portions of the adhesion layer and the barrier layer (212). More specifically, the dissolution process applies an electrolyte solution to portions of the adhesion layer and the barrier layer not within the trench to dissolve and remove such portions. The electrolyte solution may be applied within a temperature range of 20° C.

to 50° C., preferably within a range of 22° C. to 28° C. The electrolyte solution may be applied for a time duration that is sufficient to substantially remove those portions of the adhesion layer and the barrier layer not within the trench while minimizing erosion or damage to the dielectric layer. In some implementations, that time duration may range from 30 seconds to 30 minutes. In some implementations, the endpoint of the dissolution process may be determined using an electrochemical monitoring process.

In one implementation, the electrolyte solution may include a base such as sodium hydroxide (NaOH) at a 20% to 50% concentration by weight in water. In some implementations, the NaOH weight concentration may be around 30%. This yields an electrolyte solution that has good selectivity to the adhesion layer and barrier layer over the dielectric layer. For instance, the removal selectivity of this electrolyte solution for Ta:$SiO_2$ is 2.5:1. In another implementation, the electrolyte solution may use potassium hydroxide (KOH) in lieu of NaOH. The weight concentration of KOH may still range from 20% to 50%.

In further implementations of the invention, an additive may be included in the electrolyte solution that protects the dielectric layer during the dissolution of the adhesion and barrier layers. In one implementation, TEOS may be added to the electrolyte solution at a weight concentration of 0.1% to 5.0%. In some implementations a weight concentration between 0.5% and 3.0% is preferred. The TEOS tends to form reactive silanol groups in the electrolyte solution. These reactive silanol groups then react with hydroxyl groups on the surface of the silicon-based dielectric layer to attach and form protective groups over the dielectric layer. The protective groups substantially inhibit the electrolyte solution from causing further damage to the dielectric layer. Accordingly, when TEOS is added, the removal selectivity of the electrolyte solution for Ta:$SiO_2$ increases to around 5:1. In further implementations, alternate reactive silicon-based additives that selectively protect dielectric materials may be used in conjunction with or in lieu of TEOS.

Further additives may be used as well. In some implementations, a metal-protecting agent such as benzotriazole (BTA) may be added at a weight concentration between 0.05% and 1.0%. The addition of BTA reduces corrosive effects on the metal layer. For instance, BTA tends to minimize corrosion to the copper layer that may occur when the electrolyte solution is applied.

FIG. 3C illustrates the result of the dissolution process using the electrolyte solution to dissolve portions of the adhesion layer 308 and the barrier layer 306 that are sited outside of the trench 304. This dissolution process therefore substantially completes fabrication of the metal interconnect. And contrary to the conventional process described in FIGS. 1A to 1F, the dissolution process significantly protects the dielectric layer from erosion, thereby reducing loss of trench depth and allowing the metal interconnect to substantially preserve its thickness. And as will be recognized by those of skill in the art, preserving the thickness of the copper interconnect precludes increases to its electrical resistance.

Accordingly, a process has been described for fabricating a metal interconnect where excess portions of the adhesion layer and the barrier layer are removed by way of a dissolution process. This process yields a metal interconnect that is thicker than interconnects formed using conventional processes. As explained above, this is because convention interconnects suffer from erosion of the dielectric layer when a CMP process is used to remove the excess portions of the adhesion and barrier layers.

The methods described above enable fragile ultra-low-k dielectric materials to still be used with hard barrier and adhesion layers formed from titanium, tantalum, ruthenium, and their alloys with nitrogen, silicon, and carbon. The dissolution process reduces the loss of copper metal and dielectric material, substantially reduces mechanical defects such as delaminations, bent lines, and scratches, and enables line size scaling of interconnects.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising: depositing a first metal layer on a dielectric layer having a trench formed therein;
   depositing a second metal layer on the first metal layer;
   removing a portion of the second metal layer using a CMP process; and
   removing a portion of the first metal layer using a dissolution processhy applying an electrolyte solution to the portion of the first metal layer, wherein the electrolyte solution comprises a base at a 20% to 50% concentration by weight in water and a silicon-based additive that selectively protects the dielectric layer.

2. The method of claim 1, wherein at least a portion of the first metal layer comprises a metal chosen from the group consisting of tantalum, titanium, ruthenium, tantalum nitride, titanium nitride, ruthenium nitride, tantalum silicide, titanium silicide, ruthenium silicide, tantalum carbide, titanium carbide, and ruthenium carbide.

3. The method of claim 1, wherein the second metal layer comprises copper, a copper alloy, aluminum, an aluminum alloy, silver, or a silver alloy.

4. The method of claim 1, wherein the base comprises NaOH or KOH.

5. The method of claim 1, wherein the silicon-based additive comprises TEOS at a 0.1% to 5.0% concentration by weight.

6. The method of claim 1, wherein the electrolyte solution further comprises a metal-protecting agent.

7. The method of claim 6, wherein the metal-protecting agent comprises BTA at a 0.05% and 1.0% concentration by weight.

8. The method of claim 1, wherein the electrolyte solution is applied at a temperature between around 20° C. and around 50° C.

9. The method of claim 1, wherein the electrolyte solution is applied for a time duration that range from around 30 seconds to 30 minutes.

10. The method of claim 1, wherein the electrolyte solution is applied until an endpoint is detected by an electrochemical monitoring process.

11. A method comprising:
    providing a substrate having a dielectric layer and a trench formed in the dielectric layer;

depositing a barrier layer on the dielectric layer, wherein the barrier layer is substantially conformal to the dielectric layer and to the sidewalls and bottom of the trench;

depositing a metal layer over the barrier layer, wherein the metal layer fills the trench;

removing a portion of the metal layer sited outside of the trench using a CMP process; and removing a portion of the barrier layer sited outside of the trench using a dissolution process by aDplying an electrolyte solution to the portion of the barrier layer sited outside of the trench, wherein the electrolyte solution comprises:

NaOH at a 20% to 50% concentration by weight in water;
TEOS at a 0.1% to 5.0% concentration by weight; and
BTA at a 0.05% and 1.0% concentration by weight.

12. A method comprising:

providing a substrate having a dielectric layer and a trench formed in the dielectric layer;

depositing a barrier layer on the dielectric layer, wherein the barrier layer is substantially conformal to the dielectric layer and to the sidewalls and bottom of the trench;

depositing a metal layer over the barrier layer, wherein the metal layer fills the trench;

removing a portion of the metal layer sited outside of the trench using a CMP process; and removing a portion of the barrier layer sited outside of the trench using a dissolution process by applying an electrolyte solution to the portion of the barrier layer sited outside of the trench, wherein the electrolyte solution comprises:

KOH at a 20% to 50% concentration by weight in water;
TEOS at a 0.1% to 5.0% concentration by weight; and
BTA at a 0.05% and 1.0% concentration by weight.

13. A method comprising;

depositing a barrier layer on a dielectric layer having a trench formed therein;

depositing an adhesion layer on the barrier layer;

depositing a metal layer on the adhesion layer;

removing the metal layer using a CMP process until at least a portion of the adhesion layer is exposed; and removing portions of the adhesion layer and the barrier layer sited substantially outside of the trench using a dissolution process.

14. The method of claim 13, wherein the barrier layer comprises tantalum, titanium, ruthenium, tantalum nitride, titanium nitride, ruthenium nitride, tantalum suicide, titanium silicide, ruthenium silicide, tantalum carbide, titanium carbide, or ruthenium carbide.

15. The method of claim 13, wherein the adhesion layer comprises tantalum, titanium, ruthenium, copper, aluminum, or silver.

16. The method of claim 13, wherein the metal layer comprises copper, a copper alloy, aluminum, an aluminum alloy, silver, or a silver alloy.

17. The method of claim 13, wherein the dissolution process comprises applying an electrolyte solution to the portions of the adhesion layer and the barrier layer sited substantially outside of the trench.

18. The method of claim 17, wherein the electrolyte solution comprises a base at a 20% to 50% concentration by weight in water.

19. The method of claim 18, wherein the base comprises NaOH or KOH.

20. The method of claim 18, wherein the electrolyte solution further comprises a silicon-based additive that selectively protects the dielectric layer.

21. The method of claim 20, wherein the silicon-based additive comprises TEOS at a 0.1% to 5.0% concentration by weight.

22. The method of claim 18, wherein the electrolyte solution further comprises a metal-protecting agent.

23. The method of claim 22, wherein the metal-protecting agent comprises BTA at a 0.05% and 1.0% concentration by weight.

* * * * *